(12) United States Patent
Hsu et al.

(10) Patent No.: US 6,680,531 B2
(45) Date of Patent: Jan. 20, 2004

(54) MULTI-CHIP SEMICONDUCTOR PACKAGE

(75) Inventors: Chin-Teng Hsu, Taichung (TW); Fu-Di Tung, Changhua (TW); Chen-Shih Yu, Taichung (TW); Jui-Hsiang Hung, Taichung (TW); Chin-Yuan Hung, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 19 days.

(21) Appl. No.: 10/007,406

(22) Filed: Dec. 3, 2001

(65) Prior Publication Data

US 2003/0047754 A1 Mar. 13, 2003

(30) Foreign Application Priority Data

Sep. 13, 2001 (TW) .................................. 90122703 A

(51) Int. Cl.⁷ .............................................. H01L 23/34
(52) U.S. Cl. ...................... 257/723; 257/666; 257/692; 257/778; 257/787; 438/106; 438/126; 438/127
(58) Field of Search ................... 257/666, 692, 257/778, 787; 438/106, 126, 127

(56) References Cited

U.S. PATENT DOCUMENTS

| | | | |
|---|---|---|---|
| 5,527,740 A | 6/1996 | Golwalkar et al. ......... 437/206 |
| 5,793,108 A | 8/1998 | Nakanishi et al. .......... 257/723 |
| 6,150,709 A | * 11/2000 | Shin et al. .................. 257/666 |
| 6,214,640 B1 | * 4/2001 | Fosberry et al. ............ 438/106 |

* cited by examiner

Primary Examiner—David Nelms
Assistant Examiner—Mai-Huong Tran
(74) Attorney, Agent, or Firm—Peter F. Corless; Steven M. Jensen; Edwards & Angell, LLP

(57) ABSTRACT

A multi-chip semiconductor package is proposed, in which a lead frame is formed with a chip carrier that consists of at least one supporting frame and a plurality of downwardly extending portions integrally formed with the supporting frame. As the chip carrier occupies small space, this does not impede flowing of a molding compound used for forming an encapsulant. The adjacent extending portions are provided with sufficient space therebetween for allowing the molding compound to flow through the space, so that problems of incomplete filling with the molding compound and the formation of voids can be eliminated. Moreover, the downwardly extending portions can function as a pre-stressed structure so as to closely abut a bottom of a mold cavity after mold engagement, thereby making the chip carrier well assured in position without being dislocated.

12 Claims, 5 Drawing Sheets

MULTI-CHIP SEMICONDUCTOR PACKAGE

FIELD OF THE INVENTION

The present invention relates to semiconductor packages, and more particularly, to a semiconductor package in which a chip carrier having a plurality of downwardly extending portions is used, in place of a die pad, to accommodate a semiconductor chip thereon.

BACKGROUND OF THE INVENTION

In response to a trend in profile miniaturization of electronic products, semiconductor devices are desirably made with reduction of costs, high performance and compactness in size. Accordingly, several small-scale semiconductor packages are developed, for example, a TSOP (thin small outline package), SSOP (shrink small outline package) or TQFP (thin quad flat package) is dimensioned in thickness of only 1 mm, and even a UTSOP (ultra thin small outline package) is merely 0.75 mm thick. Further, a semiconductor package is preferably incorporated with two or more semiconductor chips, so as to enhance its integrated circuit density, memory capacity and processing speed.

U.S. Pat. No. 5,527,740 discloses a multi-chip thin semiconductor package. As shown in FIG. 1, this conventional semiconductor package 1 employs a lead frame 10, in which an adhesive layer 11 is formed on each of front and back sides 100, 101 of a die pad 102 of the lead frame 10, allowing a first chip 12 and a second chip 13 to be mounted on the back and front sides 101, 100 of the die pad 102, respectively. A plurality of first gold wires 14 and second gold wires 15 are used to electrically connect the first and second chips 12, 13 to leads 103 positioned around the die pad 102. And an encapsulant 16 is formed to encapsulate the first chip 12, the second chip 13, the gold wires 14, 15 and partially the leads 103, so as to prevent chip surfaces from being damaged by external moisture and contaminant.

In such a conventional lead-frame based semiconductor package, the die pad 102 is designed correspondingly to predetermined chip dimensions. As shown in FIG. 2, during a molding process, a melted molding resin 16 (designated by the same numeral as the encapsulant 16) is injected into an encapsulating mold 19. A mold flow of the molding resin 16 is impeded when flowing to the die pad 102 and the first and second chips 12, 13 mounted on the die pad 102, and diverted into an upper mold flow 17 and a lower mold flow 18, wherein the upper mold flow 17 passes the second gold wires 15, the second chip 13 and an upper mold cavity 192 of the encapsulating mold 19, while the lower mold flow 18 goes through the first gold wires 14, the first chip 12 and a lower mold cavity 193 of the encapsulating mold 19; this then entirely encapsulates the die pad 102 and the first and second chips 12, 13 in the encapsulant 16. However, in response to miniaturization in package profile (i.e. reduction in mold cavity height of the encapsulating mold 19), the foregoing semiconductor package 1 generates several problems. First, the encapsulant 16 of the semiconductor package 1 decreases in thickness due to height reduction of mold cavities 192, 193; this deteriorates mechanical strength of the encapsulant 16, and possibly results in delamination occurring at interfaces among the chips 12, 13, the die pad 102 and the encapsulant 16 formed on the chips 12, 13 due to differences in coefficients of thermal expansion during a temperature cycle in subsequent fabrication processes, so that quality and reliability of fabricated products are seriously degraded.

On the other hand, when overall height H of the mold cavities 192, 193 is reduced to 1 mm or even to 0.75 mm (as used for the above UTSOP semiconductor package), after combined thickness including the first and second chips 12, 13, the adhesive layers 11, 11 formed on the front and back sides 100, 101 of the die pad 102 and the die pad 102 itself, is subtracted from the overall height H, it can be calculated from the below equation that a gap left in each of the mold cavities 192, 193 is only 8 mils wide in average (one mil equals to one thousandth of an inch) for allowing the upper mold flow 17 or the lower mold flow 18 to pass therethrough. The equation is illustrated as follows:

$$[1-(0.2\times 2+0.03\times 2+0.13)]/2=0.205(mm) \text{ (this is approximately equal to 8 mils)},$$

wherein the overall height H of the mold cavities is 1 mm, a single chip is 0.2 mm thick, a single adhesive layer is 0.03 mm thick, and the die pad is 0.13 mm in thickness.

As only the 8-mil gap is left between a top surface of the mold cavity and the chip for allowing the mold flow to go therethrough, such a gap is actually the minimal space permeable for the mold flow, and thus it often results in voids in encapsulant 16 due to incomplete filling with the molding resin or air left in the mold cavity. In FIG. 2 in case of the gold wires 14, 15 having wire loop height of 6 mils, then a gap "s" between wire loops and the mold cavity for allowing the mold flow to go therethrough can only be 2 mils wide. Such a gap is so narrow and difficult to be permeated by the mold flow, and unbalanced speed of upper and lower mold flows 17, 18 easily result in die pad floating, thereby making the first gold wires 14 exposed to the outside of the encapsulant 16, as indicated by the dotted-line circle in FIG. 2.

In addition, U.S. Pat. No. 5,793,108 discloses another multi-chip thin semiconductor package with stacked chips mounted on a front side of a die pad. As shown in FIG. 3, this semiconductor package 1' is fabricated in a manner that, a first chip 12' is attached onto a die pad 102' with its front surface (circuit surface) facing downwardly, and then a second chip 13' is stacked on a back surface of the first chip 12'. The first and second chips 12', 13' are both dimensionally larger than the die pad 102', so as to reduce contact area between the chip 12' and the die pad 102'. Subsequently, after the chips 12', 13' are electrically connected to a plurality of leads 103' positioned around the die pad 102' by means of gold wires 14', 15', an encapsulant 16' is formed to encapsulate the first chip 12', the second chip 13', the gold wires 14', 15', and the die pad 102'; this then completely fabricates the multi-chip semiconductor package 1'.

However, such a semiconductor package 1' also has similar problems or drawbacks as the above semiconductor package 1 disclosed in U.S. Pat. No. 5,527,740. Referring to FIG. 4, in order to provide more space for accommodating chips without altering the package profile, the semiconductor package 1' has the die pad 102' positioned lower in elevation than a plane formed by the leads 103'. Such an arrangement however significantly narrows down a gap between the die pad 102' and a lower mold cavity 193' for allowing a mold flow to pass therethrough, and thereby makes a lower mold flow 18' that goes through the narrowed gap move much slower than an upper mold flow 17'. Then, the upper mold flow 17' rapidly encapsulates the chip 13', and generates a downward pressure that presses the die pad 102'; this results in die pad floating and undesirably makes the gold wires 14', 15' exposed to the outside of the encapsulant 16'.

SUMMARY OF THE INVENTION

A primary objective of the present invention is to provide a multi-chip thin semiconductor package, in which a chip carrier with a plurality of downwardly extending portions is used, in place of a die pad, for accommodating semiconductor chips thereon, so as to balance upper and lower mold flows, and prevent die pad floating from occurrence.

Another objective of the invention is to provide a multi-chip thin semiconductor package with a chip carrier having a plurality of downwardly extending portions, so as to balance upper and lower mold flows, and prevent gold wires from being exposed to the outside of an encapsulant.

Still another objective of the invention is to provide a multi-chip thin semiconductor package with a chip carrier having a plurality of downwardly extending portions, so as to reduce the occurrence of delamination among the chips, the die pad and the encapsulant that is caused by different thermal stresses applied on the chip carrier and the chips.

A further objective of the invention is to provide a multi-chip thin semiconductor package with a chip carrier having a plurality of downwardly extending portions, in place of a die pad, so that space previously occupied by the die pad is used for allowing a mold flow to pass therethrough with reduced flow resistance, so as to improve fluidity of a mold flow, and avoid the formation of voids in an encapsulant of the semiconductor package.

A further objective of the invention is to provide a multi-chip thin semiconductor package with a chip carrier with a plurality of downwardly extending portions, in place of a die pad, so that more space is provided for accommodating more semiconductor chips.

In accordance with the above and other objectives, the present invention proposes a multi-chip thin semiconductor package, comprising: a lead frame having at least one chip carrier formed at a central position thereof and a plurality of leads surrounding the chip carrier, wherein the chip carrier is dimensionally smaller in surface area and width than chips to be mounted on the chip carrier, and consists of at least one supporting frame and a plurality of downwardly extending portions integrally formed with the supporting frame; a first chip having its front surface attached onto a surface of the supporting frame by means of an adhesive layer, and electrically connected to the leads by a plurality of first gold wires; a second chip stacked on a back surface of the first chip and electrically connected to the leads by a plurality of second gold wires; and an encapsulant formed by a molding compound for encapsulating the semiconductor chips, the gold wires and partially the leads.

As compared to a conventional semiconductor package in the use of a die pad, the invention employs the chip carrier with the downwardly extending portions formed on the lead frame, in place of the die pad, for accommodating the semiconductor chips thereon. Since the extending portions integrally connected with the supporting frame only occupy small space, this therefore relatively reduces contact area between the supporting frame and the first chip, so that delamination can be prevented from occurrence that is caused by different thermal stresses applied to the supporting frame and the first chip. Further, the provision of the chip carrier does not impede a mold flow of the molding compound, but provides more space for the mold flow to pass therethrough, wherein the enlarged space in each side of a mold cavity is around 11.2 mils wide that is calculated by subtracting heights of two semiconductor chips (0.2 mm×2) and an adhesive layer (0.03 mm) from entire height of the mold cavity (1 mm), i.e. [1−0.2×2−0.03]/2=0.285 mm=11.2 mils. Such a space is significantly larger than a gap of 8 mils wide as previously calculated for the conventional semiconductor package. As a result, the enlarged space provided for the mold flow can accordingly improve the fluidity of the mold flow, and eliminates problems of incomplete filling with the molding compound and formation of voids. Moreover, since the chip carrier does not interfere with the mold flow, thus the downwardly extending portions can be dimensioned as to even reduce the space between the first chip and a lower mold cavity to a minimal gap of 8 mils wide, so as to maximally maintain space above the second chip for accommodating more chips.

On the other hand, the downwardly extending portions of the chip carrier can function as a pre-stressed structure, which can generate a pre-stressing force for allowing the extending portions to closely abut the bottom of the lower mold cavity after mold engagement; this can therefore prevent the chip carrier from being dislocated due to mold flow impact, and eliminate partial exposure of the gold wires to the outside of the encapsulant.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

The following description is made with reference to FIGS. 5–8 for illustrating in detail the preferred embodiments of a multi-chip thin semiconductor package of the present invention. In order to clearly depict a package-fabricating method of the invention, a dual-chip semiconductor package is exemplified in a first preferred embodiment. Under a condition without altering the package height, the semiconductor package of the invention can be incorporated with a single chip, or three or more chips therein. Moreover, the package-fabricating method of the invention recited in the following preferred embodiments can also be applied to a lead-frame based semiconductor package.

First Preferred Embodiment

Figure 1:
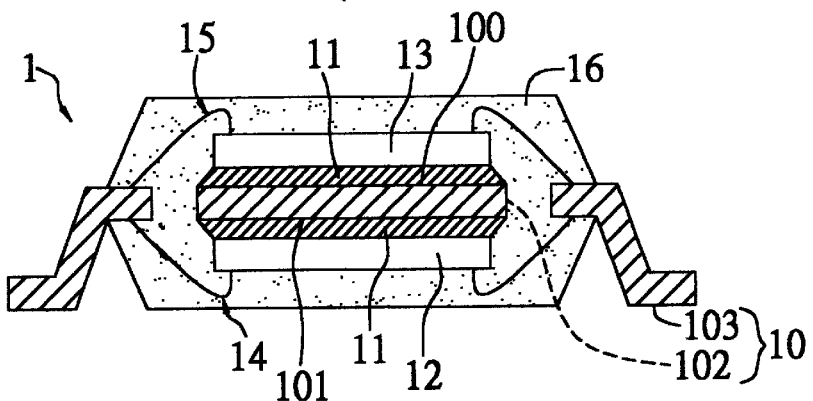
FIG. 1 (PRIOR ART) is a cross-section view of a multi-chip thin semiconductor package disclosed in U.S. Pat. No. 5,527,740.
Figure 2:
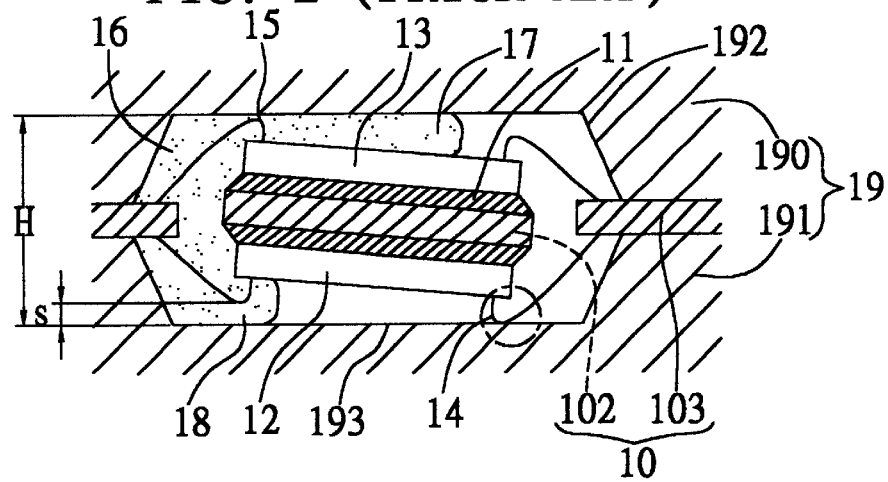
FIG. 2 (PRIOR ART) is a cross-section schematic diagram showing gold wires exposed to outside of an encapsulant due to mold flow unbalance in a semiconductor package of FIG. 1 during a molding process.
Figure 3:
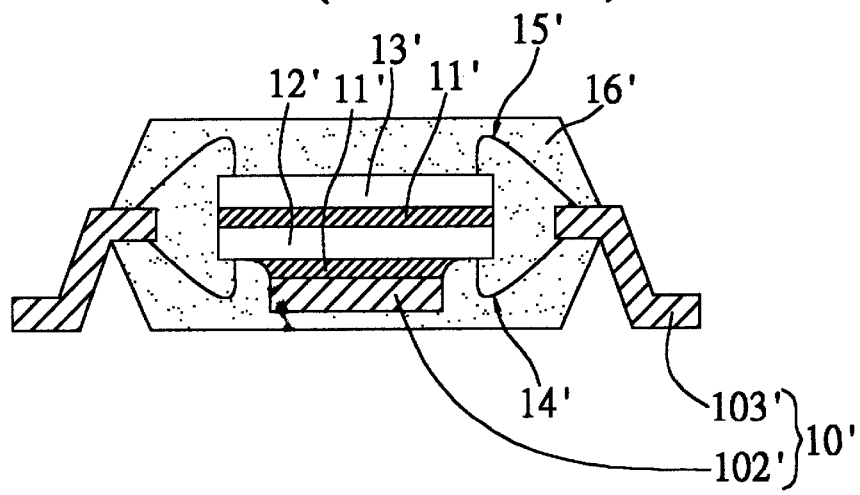
FIG. 3 (PRIOR ART) is a cross-section view of a multi-chip thin semiconductor package disclosed in U.S. Pat. No. 5,793,108, FIG. 4 (PRIOR ART) is a cross-section schematic diagram showing die pad floating occurring in a molding process due to mold flow unbalance in a semiconductor package of FIG. 3.
Figure 4:
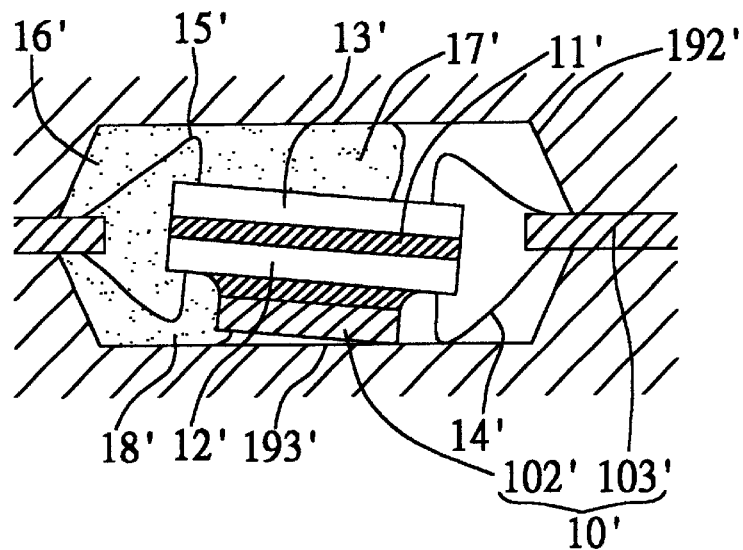
Figure 5:
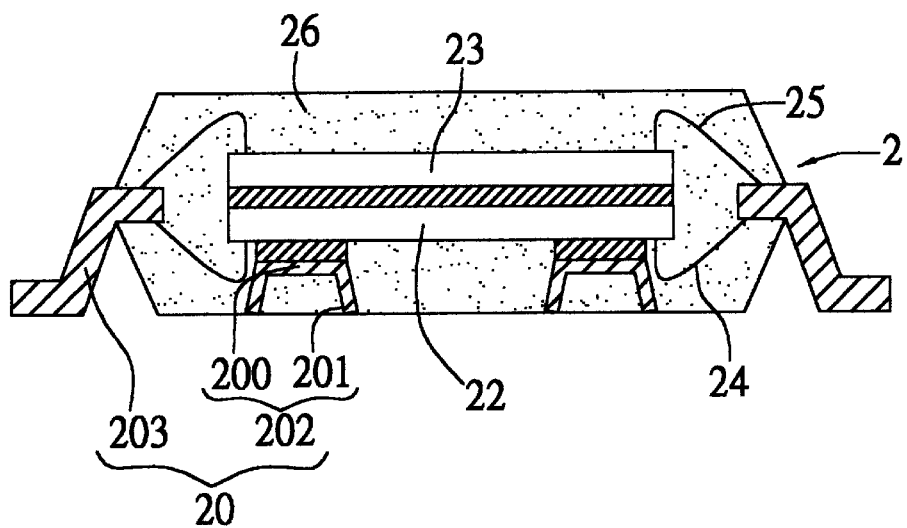
FIG. 5 is a cross-section view of a multi-chip thin semiconductor package of a first preferred embodiment of the invention.

Referring to FIG. 5, it illustrates a cross-section view of a multi-chip thin semiconductor package of a first preferred embodiment of the invention. As shown in the drawing, this semiconductor package 2 comprises: a metal lead frame 20 having a supporting frame 200 located at a central position for accommodating semiconductor chips 22, 23, wherein the supporting frame 200 is integrally formed with a plurality of downwardly extending portions 201, and the supporting frame 200 together with the downwardly extending portions 201 are used as a chip carrier 202, a first chip 22 mounted on the supporting frame 200 and electrically connected to a plurality of leads 203 around the supporting frame 200 by means of first gold wires 24; a second chip 23 mounted on the first chip 22 and electrically connected to the leads 203 by means of second gold wires 25; and an encapsulant 26 for encapsulating the first and second chips 22, 23, the first gold wires 24, the second gold wires 25 and partially the lead 203.

Figure 6A:
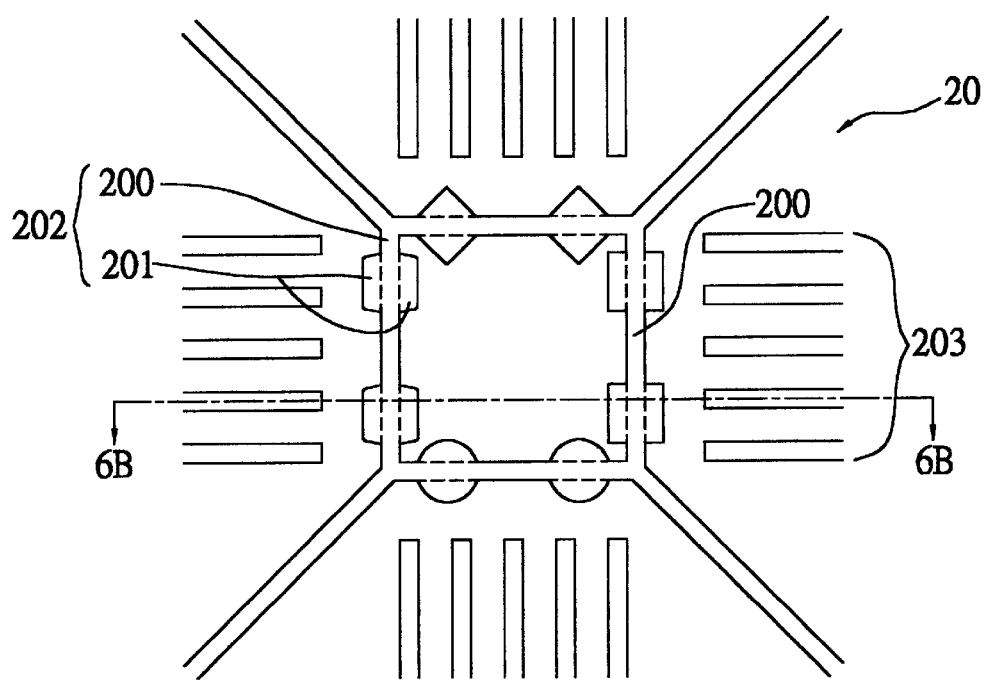
FIGS. 6A–6D are schematic diagrams illustrating a method for fabricating a multi-chip thin semiconductor package of a first preferred embodiment of the invention.
Figure 6B:
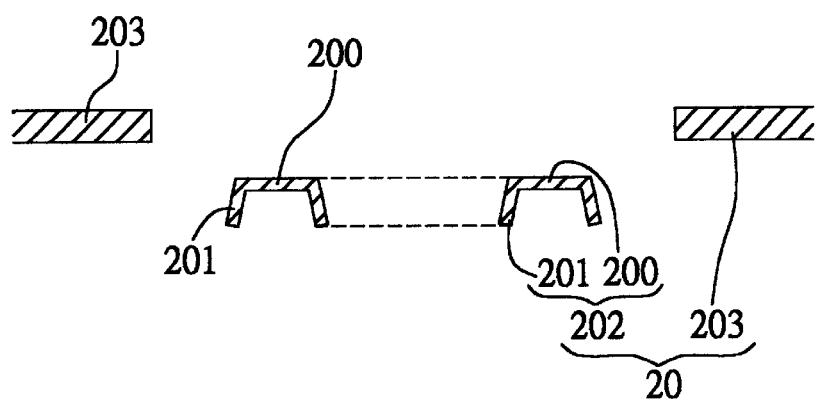

As shown in FIG. 6A (a top view of a lead frame) and FIG. 6B (a cross-section view of a lead frame), a lead frame 20 is in advance prepared, which is made of copper, copper alloy or the like. At least one supporting frame 200 is formed at a central position of the lead frame 20, and is dimensionally smaller in surface area and width than a semiconductor chip (not shown) to be mounted thereon. A plurality of leads 203 are disposed around the supporting frame 200. Further, the supporting frame 200 is integrally formed with a plurality of downwardly extending portions 201 that can be in a shape of semi-circle, rectangle, triangle or trapezoid, wherein the downwardly extending portions 201 together with the supporting frame 200 act as a chip carrier 202.

Figure 6C:
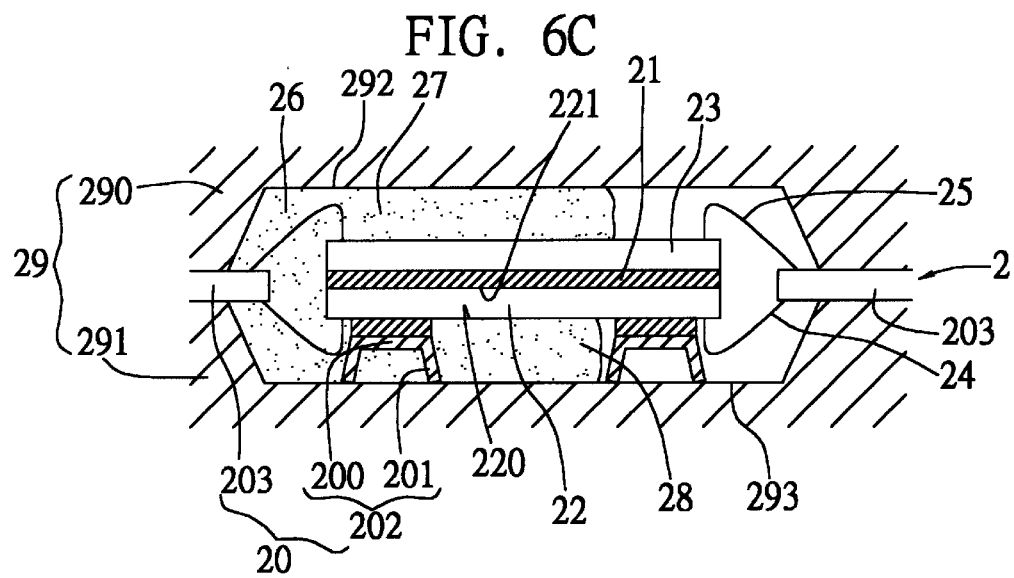

As shown in FIG. 6C, a first semiconductor chip 22 having an active surface 220 (i.e. a surface with a plurality of electronic circuits and electronic elements disposed thereon) and a non-active surface 221 is provided. After the active surface 220 of the first chip 22 is attached to the supporting frame 200 by means of an adhesive layer 21, a plurality of first gold wires 24 are formed to electrically connect the first chip 22 to the leads 203. Then, a second chip 23 is adhered onto the non-active surface 221 of the first chip 22, and electrically connected to the leads 203 by a plurality of second gold wires 25. It is now ready to perform a molding process.

Figure 6D:
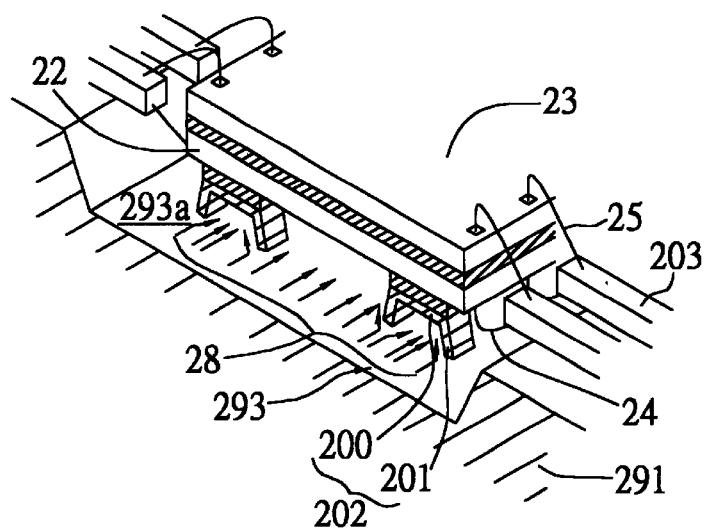

Still referring to FIG. 6C, after die bonding and wire bonding processes are completed, the semiconductor structure 2 of the invention is placed into an encapsulating mold 29 consisting of an upper mold 290 and a lower mold 291 that is engaged with the upper mold 290. The upper mold 290 and the lower mold 291 are respectively formed with an upper mold cavity 292 and a lower mold cavity 293, after mold engagement, which mold cavities 292, 293 are combined to be a space for receiving the semiconductor device 2. A melted molding resin 26 is injected into the encapsulating mold 29, and a mold flow 26 (designated by the same numeral as the molding resin 26) thereof is diverted into an upper mold flow 27 and a low mold flow 28, wherein the upper mold flow 27 passes above the second chip 23 and the upper mold cavity 292, whereas the lower mold flow 28 goes through the lower mold cavity 293 and the chip carrier 202. As shown in FIG. 6D, since the chip carrier 202 consisting of the supporting frame 200 and the downwardly extending portions 201 is in small contact area with the first chip 22, it can effectively reduce the occurrence of delamination between the first chip 22 and the supporting frame 200 that is caused by different thermal stresses applied to the first chip 22 and the supporting frame 200.

Moreover, referring to FIG. 6D, as compared to a conventional semiconductor package with a die pad, the semiconductor structure of the invention has the adjacent extending portions 201 provided with sufficient space therebetween for allowing the lower mold flow 28 to pass through the space (as indicated by arrows in FIG. 6D), so that the lower mold flow 28 is not impeded in movement, and the formation of voids can be effectively avoided. In addition, as the chip carrier 202 used for accommodating the chips 22, 23 has a vertical height properly larger than a depth of the lower mold cavity 293, after mold engagement, the downwardly extending portions 201 suffer a de-stressing force to closely abut a bottom surface 293a of the lower mold cavity 293, this can therefore prevent the chip carrier 202 from being dislocated by impact of the lower mold flow 28.

Second Preferred Embodiment

Figure 7:
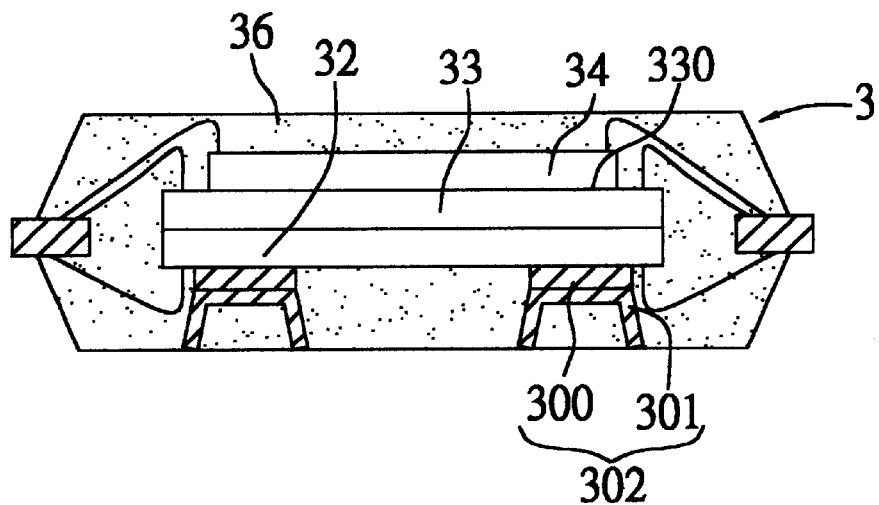
FIG. 7 is a cross-section view of a multi-chip thin semiconductor package of another preferred embodiment of the invention.
Figure 8:
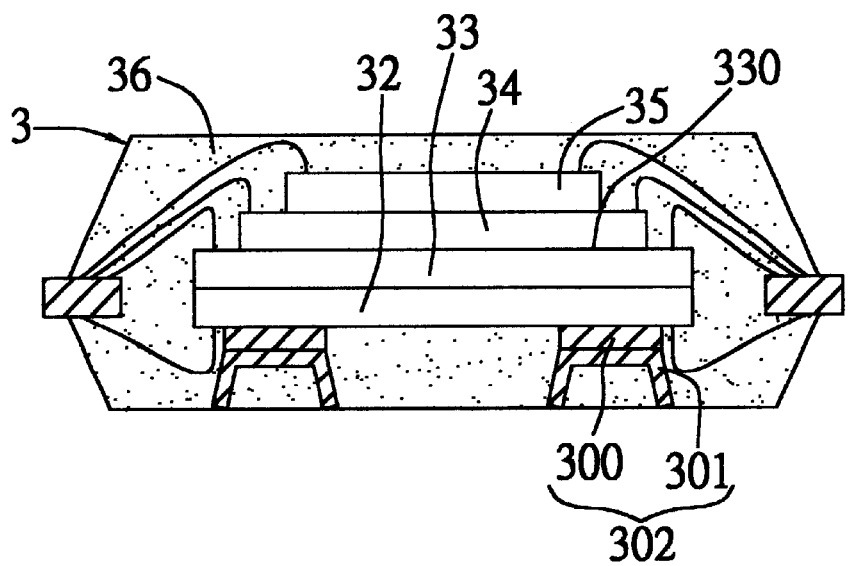
FIG. 8 is a cross-section view of a multi-chip thin semiconductor package of a further preferred embodiment of the invention.

FIGS. 7 and 8 illustrate a multi-chip thin semiconductor package 3 of a second preferred embodiment of the invention. This semiconductor package 3 of this embodiment is structurally identical to that of the first embodiment, with the only difference in that the semiconductor package 3 is incorporated with three or more semiconductor chips 32, 33, 34, (even 35). Since adjacent extending portions 301 is provided with space therebetween for allowing a mold flow to pass through the space, thus a chip carrier 302 can be positioned to be in close proximity to a lower mold bottom. This accordingly provides more space above the second chip 33 to be able to accommodate the third chip 34 or even the fourth chip 35. Therefore, with no increase in structural profile, the semiconductor package 3 can be significantly improved in functionality and performance as desired.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip semiconductor package, comprising:
   a lead frame having at least one supporting element and a plurality of leads surrounding the supporting element, wherein the supporting element is integrally formed with a plurality of downwardly extending portions that are used as a carrier structure together with the supporting element;
   a plurality of semiconductor chips stacked on the carrier structure and electrically connected to the leads; and
   an encapsulant for encapsulating the semiconductor chips and partially the leads.

2. The multi-chip semiconductor package of claim 1, wherein the semiconductor package is a thin semiconductor package.

3. The multi-chip semiconductor package of claim 1, wherein the carrier structure is dimensionally smaller in surface area and width than the semiconductor chips.

4. The multi-chip semiconductor package of claim 1, wherein the supporting element is a metal supporting frame.

5. The multi-chip semiconductor package of claim 1, wherein the extending portions are downwardly extending feet.

6. The multi-chip semiconductor package of claim 5, wherein the downwardly extending feet are of a circle shape.

7. The multi-chip semiconductor package of claim 5, wherein the downwardly extending feet are of a rectangular shape.

8. The multi-chip semiconductor package of claim 5, wherein the downwardly extending feet are of a triangular shape.

9. The multi-chip semiconductor package of claim 5, wherein the downwardly extending feet are of a trapezoid shape.

10. The multi-chip semiconductor package of claim 1, wherein the semiconductor chips are mounted on the supporting element by an adhesive layer.

11. The multi-chip semiconductor package of claim 1, wherein a space is formed between the adjacent extending portions for allowing a molding compound that is used for forming the encapsulant to flow through the space.

12. The multi-chip semiconductor package of claim 1, wherein the carrier structure is positioned to be in close proximity to a lower mold bottom of an encapsulating mold that is used for forming the encapsulant.

* * * * *